United States Patent
Weyers et al.

(10) Patent No.: US 9,728,529 B2
(45) Date of Patent: Aug. 8, 2017

(54) SEMICONDUCTOR DEVICE WITH ELECTROSTATIC DISCHARGE PROTECTION STRUCTURE

(71) Applicant: Infineon Technologies Dresden GmbH, Dresden (DE)

(72) Inventors: Joachim Weyers, Hoehenkirchen-Siegertsbrunn (DE); Franz Hirler, Isen (DE); Anton Mauder, Kolbermoor (DE); Markus Schmitt, Neubiberg (DE); Armin Tilke, Dresden (DE); Thomas Bertrams, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 14/252,429

(22) Filed: Apr. 14, 2014

(65) Prior Publication Data

US 2015/0294966 A1 Oct. 15, 2015

(51) Int. Cl.
*H01L 27/02* (2006.01)
*H01L 29/861* (2006.01)

(52) U.S. Cl.
CPC ........ *H01L 27/0255* (2013.01); *H01L 29/861* (2013.01)

(58) Field of Classification Search
None
See application file for complete search history.

(56) References Cited

U.S. PATENT DOCUMENTS

| 5,602,046 A | 2/1997 | Calafut et al. |
| 5,736,779 A * | 4/1998 | Kobayashi .......... H01L 27/0255 257/355 |
| 7,859,083 B2 * | 12/2010 | Nishimura .......... H01L 27/0255 257/603 |
| 2004/0097042 A1 | 5/2004 | Hshieh et al. |
| 2006/0261412 A1 | 11/2006 | Esmark et al. |
| 2012/0028417 A1 | 2/2012 | Hirler et al. |

FOREIGN PATENT DOCUMENTS

| DE | 102005013478 A1 | 10/2006 |
| DE | 202004021424 U1 | 2/2008 |
| DE | 102007008777 B4 | 3/2012 |

\* cited by examiner

*Primary Examiner* — Tom Thomas
*Assistant Examiner* — Steven B Gauthier
(74) *Attorney, Agent, or Firm* — Murphy, Bilak & Homiller, PLLC

(57) ABSTRACT

A semiconductor device comprises a semiconductor body having a first surface and a second surface opposite to the first surface. The semiconductor device further includes a first isolation layer on the first surface of the semiconductor body and a first electrostatic discharge protection structure on the first isolation layer. The first electrostatic discharge protection structure has a first terminal and a second terminal. A second isolation layer is provided on the electrostatic discharge protection structure. A gate contact area on the second isolation layer is electrically coupled to the first terminal of the first electrostatic discharge protection structure. An electric contact structure is arranged in an overlap area between the gate contact area and the semiconductor body. The electric contact structure is electrically coupled to the second terminal of the first electrostatic discharge protection structure and electrically isolated from the gate contact area.

20 Claims, 8 Drawing Sheets

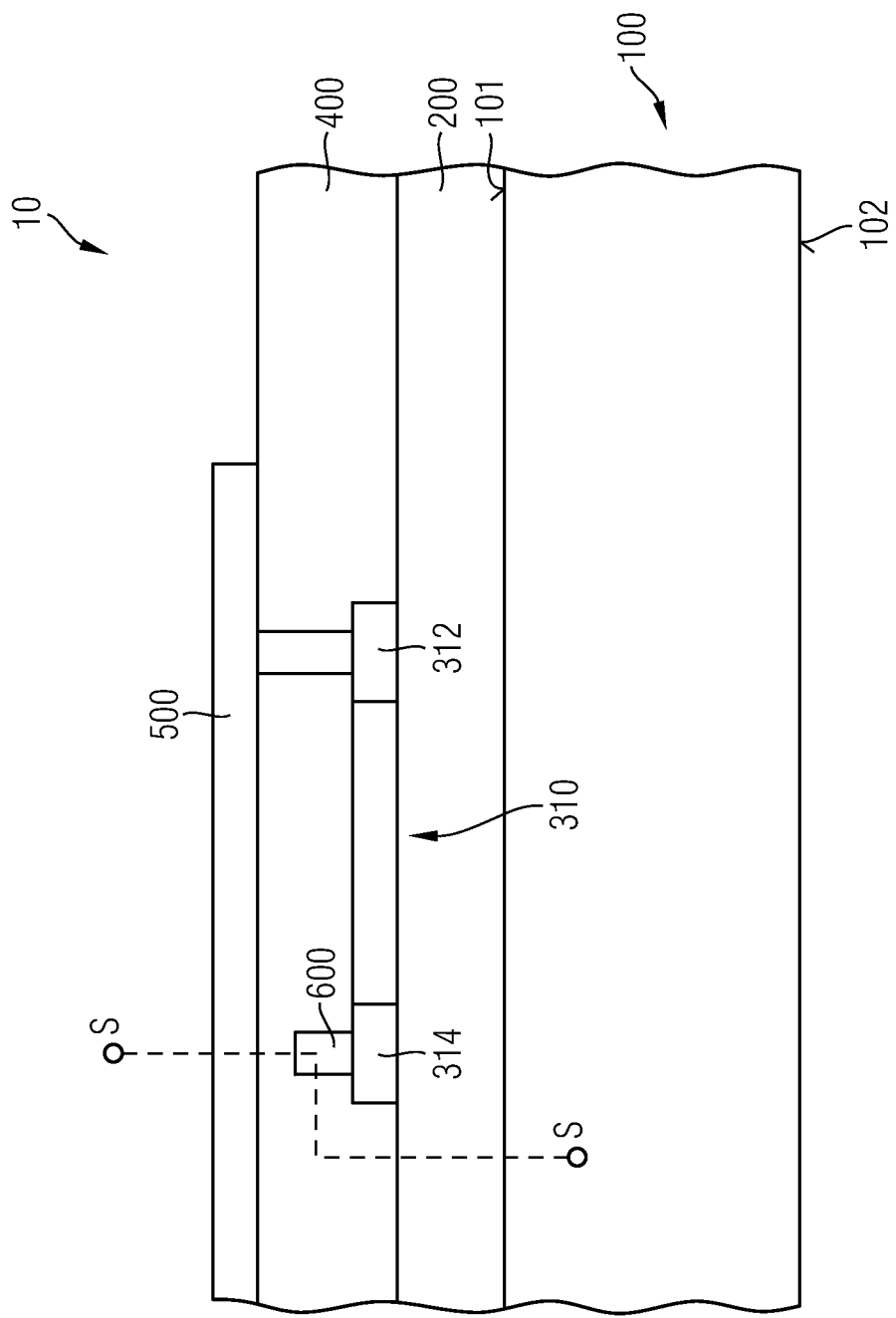

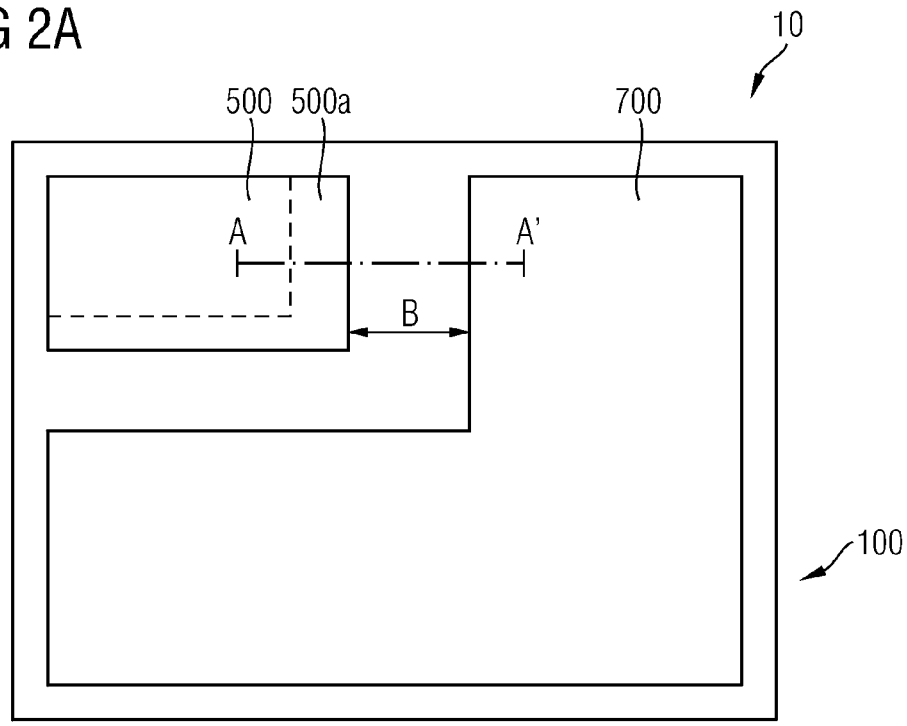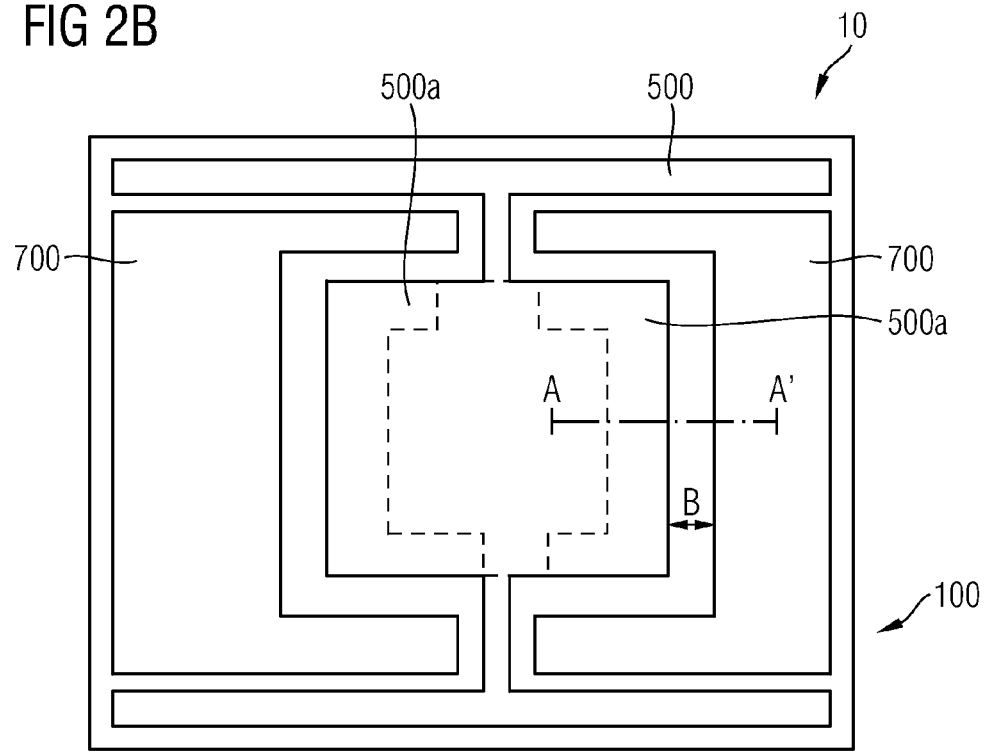

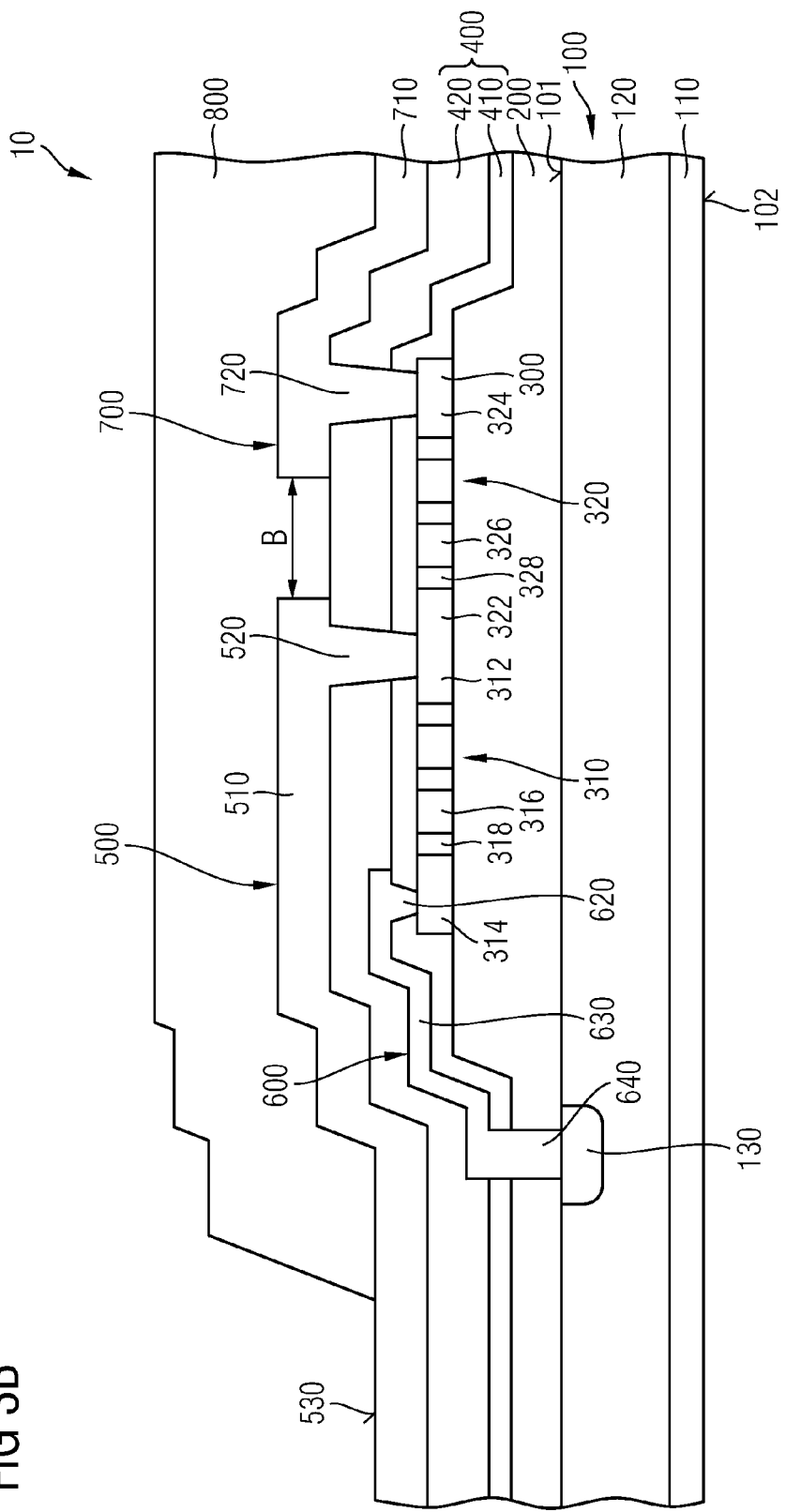

SEMICONDUCTOR DEVICE WITH ELECTROSTATIC DISCHARGE PROTECTION STRUCTURE

BACKGROUND

A key component in semiconductor application is a solid-state switch. As an example, switches turn loads of automotive applications or industrial applications on and off. Solid-state switches typically include, for example, field effect transistors (FETs) like metal-oxide-semiconductor FETs (MOSFETs) or insulated gate bipolar transistors (IGBTs).

In these applications, damage of a gate dielectric between gate and source of the transistors may be caused by an electrostatic discharge event between a gate contact area and a source contact area of the semiconductor device. To protect the gate dielectric from an electrostatic discharge event, electrostatic discharge (ESD) protection structures are provided. ESD protection structures protect the transistors from electrostatic discharge during assembly or operation, for example. These ESD protection structures require non-negligible area within the integrated semiconductor device.

It is therefore desirable to provide a semiconductor device structure with enhanced ESD protection characteristic and optimized area efficiency.

SUMMARY

According to an embodiment, a semiconductor device includes a semiconductor body having a first surface and a second surface opposite to the first surface. The semiconductor device further includes a first isolation layer on the first surface of the semiconductor body and a first electrostatic discharge protection structure on the first isolation layer. The first electrostatic discharge protection structure has a first terminal and a second terminal. A second isolation layer is provided on the electrostatic discharge protection structure. A gate contact area on the second isolation layer is electrically coupled to the first terminal of the first electrostatic discharge protection structure. An electric contact structure is arranged in an overlap area between the gate contact area and the semiconductor body. The electric contact structure is electrically coupled to the second terminal of the first electrostatic discharge protection structure and electrically isolated from the gate contact area.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1 is a schematic cross-sectional view of a portion of a semiconductor device in accordance with an embodiment.

FIGS. 2A and 2B are schematic plan views of portions of a semiconductor device in accordance with different embodiments.

FIGS. 3A to 3D are schematic cross-sectional views of portions of a semiconductor device taken along the section plane A-A' of FIG. 2A or FIG. 2B, comprising an electric contact structure arranged in an overlap area between a gate contact area and a semiconductor body in accordance with different embodiments.

DETAILED DESCRIPTION

Figure 3A:
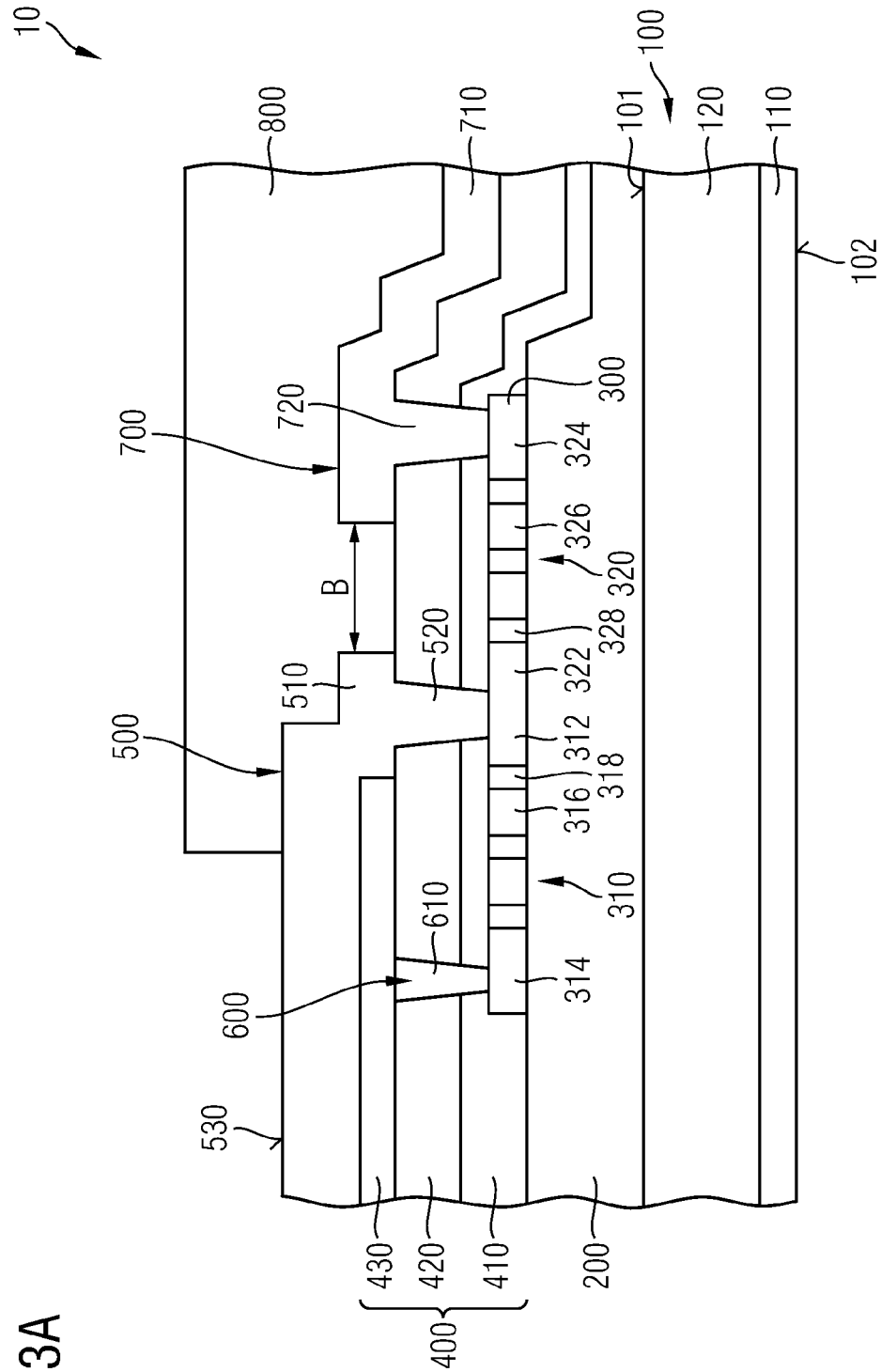

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having," "containing," "including," "comprising" and the like are open and the terms indicate the presence of stated structures, elements or features but not preclude additional elements or features. The articles "a," "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example resistors, resistive elements or elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1 is a schematic cross-sectional view of a portion of a semiconductor device 10 in accordance with an embodiment.

The semiconductor device 10 comprises a semiconductor body 100 having a first surface 101 and a second surface 102 opposite to the first surface 101. The semiconductor device 10 further comprises a first isolation layer 200 on the first surface 101 of the semiconductor body 100 and a first electrostatic discharge protection structure 310 on the first isolation layer 200. The first electrostatic discharge protection structure 310 has a first terminal 312 and a second terminal 314. A second isolation layer 400 is provided on the first electrostatic discharge protection structure 310. A gate contact area 500 on the second isolation layer 400 is electrically coupled to the first terminal 312 of the first electrostatic discharge protection structure 310. An electric contact structure 600 is arranged in an overlap area between the gate contact area 500 and the semiconductor body 100. The electric contact structure 600 is electrically coupled to the second terminal 314 of the first electrostatic discharge protection structure 310 and electrically isolated from the gate contact area 500. According to an embodiment, the electric contact structure 600 may be electrically coupled to a source terminal S, as indicated by a first dotted line in FIG. 1. By providing the electric contact structure 600 coupled to the source terminal S under the gate contact area 500, an area-efficient arrangement of the first electrostatic discharge protection structure 310 is achieved. According to another embodiment, the electric contact structure 600 may be electrically coupled to a semiconductor region within the semiconductor body 100, which is electrically coupled to the source terminal S, as indicated by a second dotted line in FIG. 1. By providing the electric contact structure 600 being electrically coupled to the semiconductor body 100, the first electrostatic discharge protection structure 310 has an enhanced thermal coupling to the semiconductor body 100.

The semiconductor device 10 may comprise power semiconductor elements such as IGBTs (insulated gate bipolar transistors), e.g. RC-IGBTs (reverse-conducting IGBTs), RB-IGBT (reverse-blocking IGBTs), and IGFETs (insulated gate field effect transistors) including MOSFETs (metal oxide semiconductor field effect transistors). The semiconductor device 10 may also comprise a superjunction transistor, a trench field effect transistor, or any further transistor device controlling a load current via a gate terminal. When reducing the chip size of the semiconductor device 10, a smaller input capacitance results in an enhanced risk of damage caused by an electrostatic discharge event between the gate and the source of the semiconductor device 10.

In the plan view of FIG. 2A, transistor cells are contacted via a source contact area 700, wherein the gate contact area 500 is provided in an edge portion of the semiconductor device 10. When forming the semiconductor device 10 as a power semiconductor element, a resulting thickness of the metallization of the gate contact area 500 and the source contact area 700 may be in a range of 1 µm to 10 µm or 3 µm to 7 µm, and the gate contact area 500 and the source contact area 700 may be separated by a minimum distance B in a range of 5 µm to 20 µm or 10 µm to 15 µm. As shown in FIG. 2B, the gate contact area 500 may be also arranged in a middle part of the semiconductor device 10, wherein the source contact area 700 surrounds the gate contact area 500.

FIG. 3A is a schematic cross-sectional view of a portion of the semiconductor device 10 taken along a section plane A-A' of FIG. 2A or FIG. 2B in accordance with an embodiment.

The semiconductor body 100 may be provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is selected to achieve a specified voltage blocking capability and may be at least 20 µm, for example at least 50 µm. Other embodiments may provide semiconductor bodies 100 with a thickness of several 100 µm. The semiconductor body 100 may have a rectangular shape with an edge length in the range of several millimeters. The normal to the first and second surfaces 101, 102 defines a vertical direction and directions orthogonal to the normal direction are lateral directions.

Figure 4A:
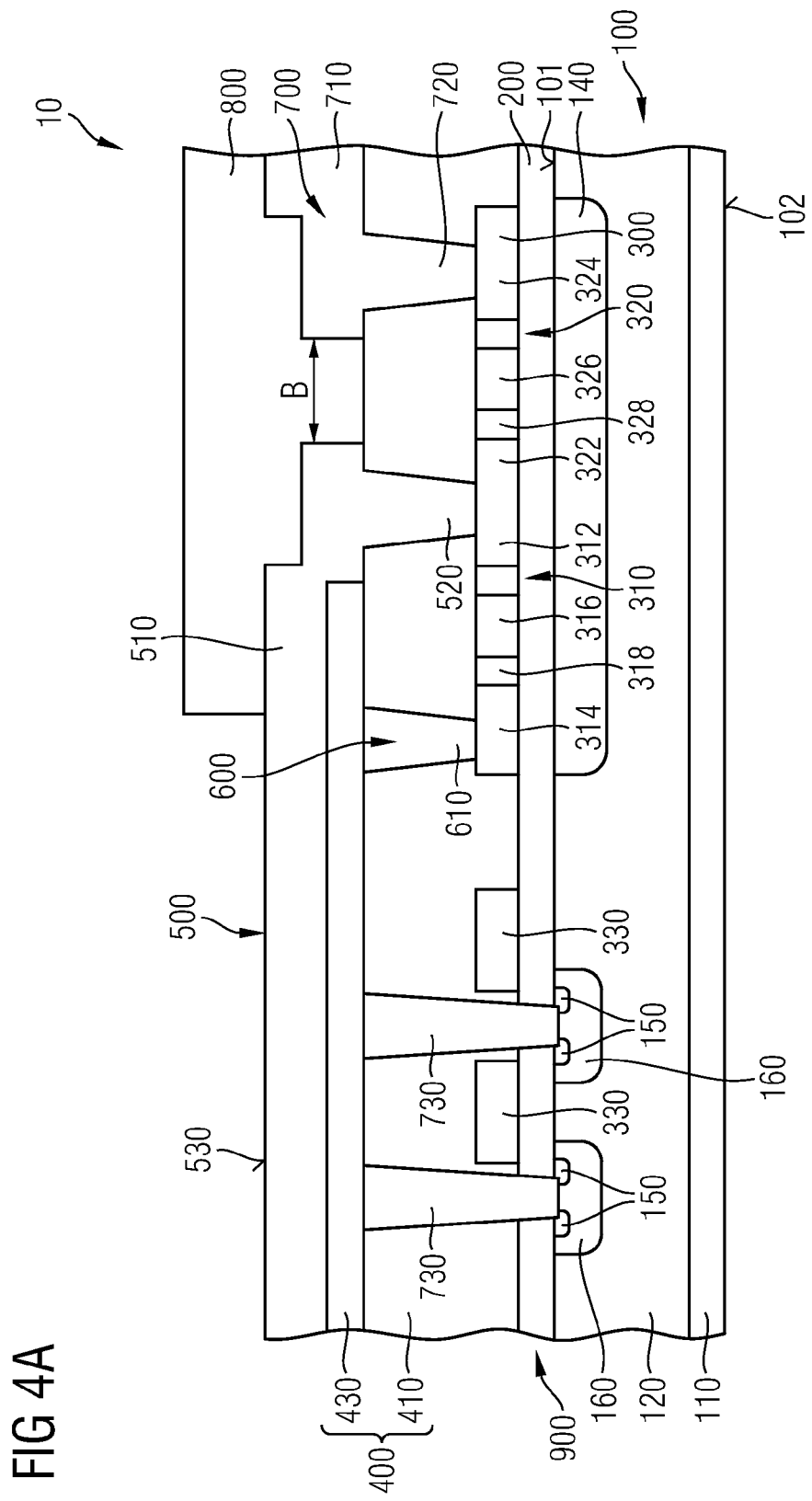
FIGS. 4A and 4B are schematic cross-sectional views of portions of a semiconductor device taken along the section plane A-A' of FIG. 2A or FIG. 2B, further comprising transistor cells arranged in an overlap area between a gate contact area and a semiconductor body in accordance with different embodiments.
Figure 4B:
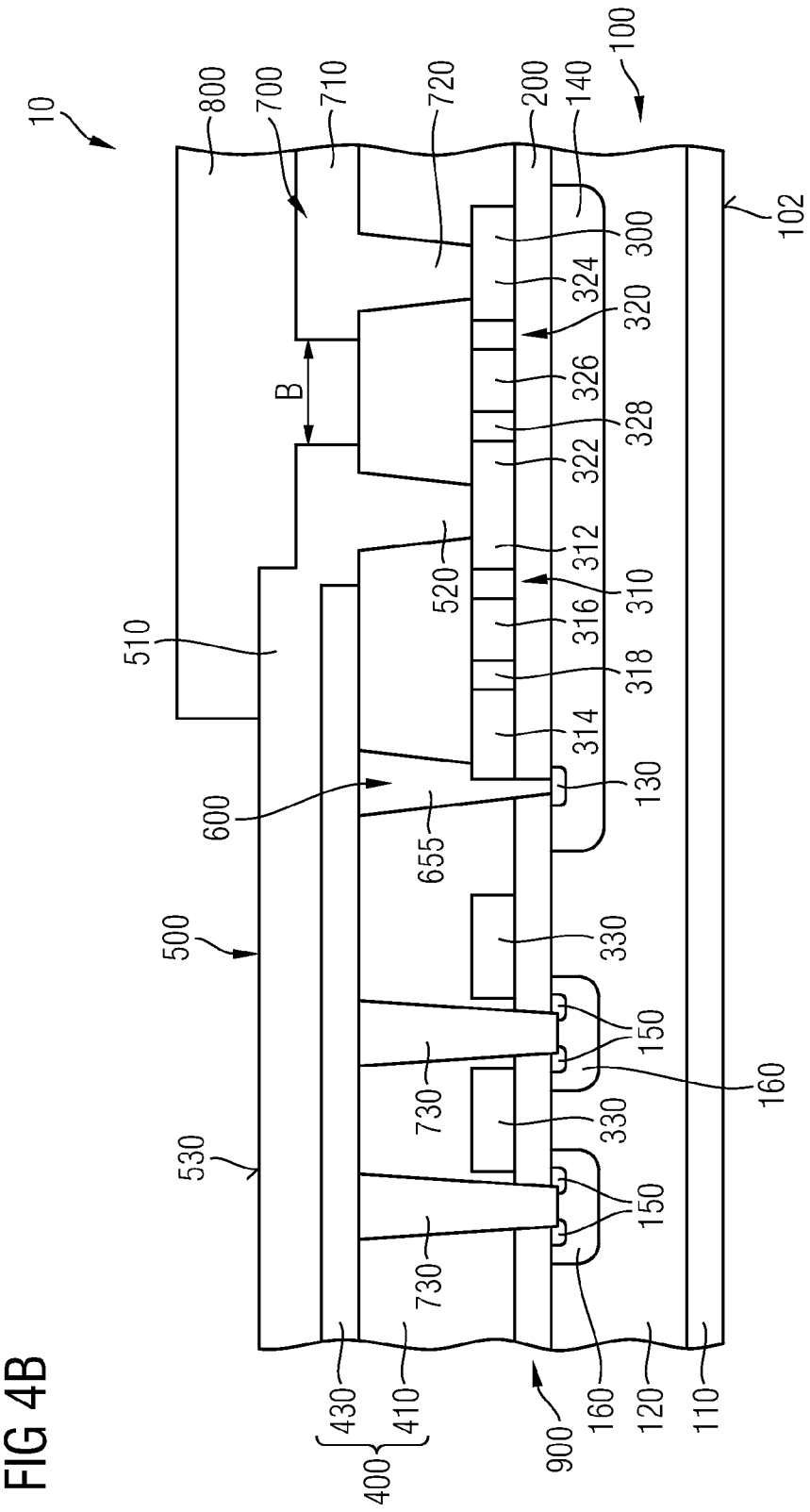

The semiconductor body 100 may comprise a drain region 110 and a drift region 120, which will be further described in view of FIGS. 4A and 4B. The first isolation layer 200 is formed on the first surface 101 of the semiconductor body 100. The first isolation layer 200 may include any dielectric or a combination of dielectrics adapted to isolate the semiconductor body 100 from the first electrostatic discharge protection structure 310 on the first isolation layer 200. The first isolation layer 200 may include one or any combination of an oxide, nitride, oxynitride, a high-k material, an imide, an insulating resin or glass, for example. The first isolation layer 200 may include a field oxide formed e.g. by a local oxidation of silicon (LOCOS) process. As can be seen in FIG. 3A, the first isolation layer 200 may include a field dielectric such as a field oxide in an overlap area between the first electrostatic discharge protection structure 310 and the semiconductor body 100 and may further include a gate dielectric such as a gate oxide in an overlap area between the source contact area 700 and the semiconductor body 100. The thickness of the field dielectric of the first isolation layer 200 may be in a range of 0.5 µm to 5 µm or 1 µm to 3 µm, the thickness of the gate dielectric of the first isolation layer 200 may be in a range of 20 nm to 150 nm or 40 nm to 120 nm.

The second isolation layer 400 is formed on the first electrostatic discharge protection structure 310 and the first isolation layer 200. The second isolation layer 400 may comprise a stack of first to third dielectric layers 410, 420 and 430. The first dielectric layer 410 may include a tetraethyl orthosilicate (TEOS)/undoped silicate glass (USG) film. The thickness of the first dielectric layer of the second isolation layer 400 may be in a range of 50 nm to 500 nm. The second dielectric layer 420 may include a phosphosilicate glass (PSG) or a borophosphosilicate glass (BPSG). The thickness of the second dielectric layer of the second isolation layer 400 may be in a range of 200 nm to 2 µm. The third dielectric layer 430 of the second isolation layer 400 may include at least one of a silicon oxide, a nitride or an oxynitride layer, which is formed between the gate contact area 500 and the electric contact structure 600. The thickness of the third dielectric layer 430 of the second isolation layer 400 may be in a range of 40 nm to 1000 nm, or in a range of 100 nm to 300 nm. The gate contact area 500 is formed on the second isolation layer 400. Next to the gate contact area 500, the source contact area 700 is formed on the second isolation layer 400, which is spaced apart from the gate contact area 500 by the distance B (cf. also FIG. 2A and FIG. 2B). On the gate contact area 500 and the source contact area 700, a passivation layer 800 is formed, which may include one or any combination of an imide, a nitride, an oxide or an oxynitride, for example.

The gate contact area 500 includes a gate contact part 510, which is electrically coupled to the first terminal 312 of the first electrostatic discharge protection structure 310 via a contact plug 520, and a gate pad 530. The gate contact part 510 of the gate contact area 500 is covered by the passivation layer 800, wherein the gate pad 530 is an exposed part of the gate contact area 500 not being covered by the passivation layer 800. The gate pad 530 may be used for providing a bonding contact to the gate contact area 500 to be connected to an external device or element. In an embodiment, the gate contact area 500 may also comprise a gate runner structure at an edge portion of the semiconductor device 10 or a gate finger structure arranged within a transistor cell array of the semiconductor device 10.

A second electrostatic discharge protection structure 320 may be provided in addition to the first electrostatic discharge protection structure 310. The second electrostatic discharge protection structure 320 may be formed together with the first electrostatic discharge protection structure 310 on the first isolation layer 200, wherein the second electrostatic discharge protection structure 320 includes a first terminal 322 electrically coupled to the gate contact area 500 via the contact plug 520 and a second terminal 324 electrically coupled to the source contact area 700. The source contact area 700 includes a source contact part 710 being electrically coupled to the source of a transistor and a contact plug 720 being electrically coupled to the second terminal 324 of the second electrostatic discharge protection structure 320. According to an embodiment, the second terminal 324 of the second electrostatic discharge protection structure 320 may be arranged in an overlap area between the source contact area 700 and the semiconductor body 100.

The gate contact area 500 and the source contact area 700 may be separate parts, e.g. due to lithographic patterning, of a common metal wiring layer, wherein the semiconductor device 10 comprises a single metal wiring layer including the gate contact area 500 and the source contact area 700, and the electric contact structure 600.

The gate contact area 500 and the source contact area 700 may be formed as a metal layer structure including the contact plugs 520, 720, the gate and source contact parts 510, 710 and the gate pad 530. Such a metal layer structure may consist of or contain, as main constituent(s), aluminum Al, copper Cu or alloys of aluminum or copper, for example AlSi, AlCu, or AlSiCu. According to other embodiments, the gate contact area 500 and the source contact area 700 may contain one, two, three or more sub-layers, each sub-layer containing, as a main constituent, at least one of nickel Ni, titanium Ti, silver Ag, gold Au, tungsten W, platinum Pt and palladium Pd. For example, a sub-layer may contain a metal nitride or a metal alloy containing Ni, Ti, Ag, Au, W, Pt, Pd and/or Co.

In the embodiment of FIG. 3A, the first electrostatic discharge protection structure 310 and the second electrostatic discharge protection structure 320 have the first terminal 312, 322 in common.

The first electrostatic discharge protection structure 310 and/or the second electrostatic discharge protection structure 320 may include at least one polysilicon diode having the first and second regions connected in series. Herein, the resulting diode may be bidirectional, having an odd number of first and second regions, e.g. a n-p-n- . . . -p-n structure. The resulting diode may also be unidirectional, having an even number of first and second regions, e.g. a n-p-n- . . . -p structure. As shown in FIG. 3A, the first electrostatic discharge protection structure 310 may include a polysilicon layer 300 on the first isolation layer 200 having first regions 316 and second regions 318 of opposite conductivity type alternatingly arranged along a lateral direction. In the same way, the second electrostatic discharge protection structure may include the polysilicon layer 300 on the first isolation layer 200 having first regions 326 and second regions 328 of opposite conductivity type alternatingly arranged along the lateral direction.

The first and second electrostatic discharge protection structures 310 and 320 may be formed simultaneously. In detail, the first electrostatic discharge protection structure 310 and the second electrostatic discharge protection structure 320 may be manufactured by forming the polysilicon layer 300 of a first conductivity type on the first isolation layer 200. After forming the polysilicon layer 300, a mask layer (not shown), e.g. a hard mask layer or a resist layer is formed on the polysilicon layer 300 and is patterned by a lithographic process, such that the second regions 318, 328 are not covered by the mask layer. In a subsequent implantation process, dopants of a second conductivity type are introduced into the exposed second regions 318, 328 not covered by the mask layer on the polysilicon layer 300, to form the second regions 318, 328 of the second conductivity type. Thus, each of the first regions 316, 326 and second regions 318, 328 comprises first dopants of the first conductivity type, and the second regions 318, 328 further comprise second dopants of the second conductivity type overcompensating the first dopants of the first conductivity type. In another embodiment, each of the first regions 316, 326 may comprise first dopants of the first conductivity type and the second regions 318, 328 may comprise second dopants of the second conductivity type only, without overcompensating the first dopants of the first conductivity type. Herein, the first dopants are introduced into the first regions 316, 318 and the second dopants are introduced into the second regions 326, 328, respectively, in a separate process, e.g. by ion implantation and/or diffusion, wherein overlapping regions between the first and second regions 316, 326; 318, 328 may comprise first and second dopants due to diffusion of the dopants.

As a result, a polysilicon diode chain or string arranged in a lateral direction having alternating pn-junctions (diodes) at the region boundaries of the first and second regions in the polysilicon layer 300 is formed. In an embodiment, the doping concentrations of the regions are adapted such that a series connections of Zener diodes are formed within the polysilicon layer 300. By the number of consecutive diodes each including a first region 316, 326 and a second region 318, 328, the breakdown voltage of the first and second electrostatic discharge protection structures 310 or 320 can be adjusted.

The length of the first and/or second electrostatic discharge protection structures 310, 320 between the first terminals 312, 322 and the second terminals 314, 324, respectively, may be in a range of 5 µm to 150 µm or 20 µm to 50 µm. An area of the first electrostatic discharge protection structure 310 according to FIGS. 3A-3D, 2A and 2B may be in a range of 5000 µm$^2$ to 10000 µm$^2$. The first electrostatic discharge protection structure 310 and the second electrostatic discharge protection structure 320 do not require additional chip area, because the first electrostatic discharge protection structure 310 is constructed between the semiconductor body 100 and the gate pad 500, and the second electrostatic discharge protection structure 320 is constructed between and partially beneath the wiring layers, e.g. metal layers, of the gate pad 500 and the source contact area 700.

Assuming a breakdown current of 1 mA per µm diode width, a robustness of the electrostatic discharge protection structures 310, 320 with respect to HBM (Human Body Model) tests may be in a range of 200 V to 5 kV. The electrostatic discharge protection structures 310, 320 of FIGS. 4A and 4B may be positioned on two opposite sides of the gate pad 500 in parallel to source contact plugs 730, which may be formed as contact holes or stripes, of transistors cells which are running underneath the gate pad 500. For a 100 µm length of the gate pad 500, the robustness of the electrostatic discharge protection structures 310, 320 with respect to HBM tests may be in a range of 500 V to 2 kV. For a 500 μm length of the gate pad 500, the robustness of the electrostatic discharge protection structures 310, 320 with respect to HBM tests may be in a range of 2 kV to 5 kV.

The second electrostatic discharge protection structures 320 may also be placed within an edge termination structure of the semiconductor device 10. The area of the electrostatic discharge protection structures 310, 320 may be in a range of 20000 μm$^2$ to 400000 μm$^2$ in case of a 4 mm long chip edge. In this case the area of the edge termination and the total chip area may be increased. Assuming a breakdown current of 1 mA per μm diode width, the robustness with respect to HBM tests would be in a range of 10 kV to 14 kV. The areas of the first and/or the second electrostatic discharge protection structures 310, 320 may be appropriately chosen for dissipating energy caused by an electrostatic discharge event (ESD event) between the gate contact area 500 and the source contact area 700.

The first terminals 312 and 322 of the first and second electrostatic discharge protection structures 310, 320 may be electrically connected. In addition, the second terminals 314 and 324 of the first and second electrostatic discharge protection structures 310, 320 may also be electrically connected, to provide an electrostatic discharge protection structure having the first and the second electrostatic discharge protection structures 310, 320 electrically connected in parallel. The number of diodes formed by the alternating pn-junctions at the region boundaries of the first regions 316, 326 and the second regions 318, 328 of the first and the second electrostatic discharge protection structures 310, 320 may be the same. In other words, the first and the second electrostatic discharge protection structures 310, 320 may be diode chains being electrically connected in parallel and having the same number of diodes. As a consequence, electric breakdown voltages of the first and the second electrostatic discharge protection structures 310, 320 are the same. Due to the provision of the first electrostatic discharge protection structure 310 connected in parallel to the second electrostatic discharge protection structure 320, a gate dielectric between gate and source is protected by both the first and the second electrostatic discharge protection structures 310, 320 from being damaged by an electrostatic discharge event between the gate contact area 500 and the source contact area 700.

The electric contact structure 600 may be arranged in an overlap area between the gate contact area 500 and the semiconductor body 100, wherein the electric contact structure 600 is electrically coupled to the second terminal 314 of the first electrostatic discharge protection structure 310 and electrically isolated from the gate contact area 500. Thus, at least the second terminal 314 of the first electrostatic discharge protection structure 310 may be arranged under the gate contact area 500. At least 25% of the first electrostatic discharge protection structure 310 may be arranged in the overlap area between the gate contact area 500 and the first isolation layer 200. According to an embodiment, at least 25% of the polysilicon layer 300 comprising the first and second electrostatic discharge protection structures 310, 320 may be arranged in the overlap area between the gate contact area 500 and the first isolation layer 200.

By providing the first electrostatic discharge protection structure 310 in an overlap area between the gate contact area 500 and the first isolation layer 200, an additional electrostatic discharge protection element can be integrated in the semiconductor device 10 without additional area consumption of the chip surface of the semiconductor device 10. In addition, by providing both the second electrostatic discharge protection structure 320 and the first electrostatic discharge protection structure 310 being connected in parallel to the gate contact area 500 via the contact plug 520, the capability of the ESD-protection of the semiconductor device 10 can be enhanced. In an embodiment, at least 80% of the first electrostatic discharge protection structure 310 (without the second electrostatic discharge protection structure 320) may be arranged in the overlap area between the gate contact area 500 and the first isolation layer 200. In another embodiment, at least 70% of the first electrostatic discharge protection structure 310 (without the second electrostatic discharge protection structure 320) may be arranged in the overlap area between the gate contact area 500 and the first isolation layer 200. In still another embodiment, at least 60% of the first electrostatic discharge protection structure 310 (without the second electrostatic discharge protection structure 320) may be arranged in the overlap area between the gate contact area 500 and the first isolation layer 200.

As can be seen from FIG. 3A, the electric contact structure 600 is arranged in an overlap area between the gate pad 530 of the gate contact area 500 and the semiconductor body 100. Thus, at least the second terminal 314 of the first electrostatic discharge protection structure 310 may be arranged under the gate pad 530. According to an embodiment, the second terminal 314 of the first electrostatic discharge protection structure 310 may be arranged in an overlap area between the gate contact area 500 and the semiconductor body 100. As a result, the space under the gate pad 530 is used efficiently for electrostatic discharge protection.

In an embodiment, the electric contact structure 600 includes a contact plug 610, which extends through the second dielectric layer 420 and the first dielectric layer 410 of the second isolation layer 400 to a top surface of the polysilicon layer 300 including the second terminal 314 of the first electrostatic discharge protection structure 310. The contact plug 610 of the electric contact structure 600 is covered by the third dielectric layer 430 providing an electric isolation between the gate contact area 500 and the contact plug 610. The contact plug 610 of the electric contact structure 600 may be formed simultaneously with the contact plug 520 of the gate contact area 500 and the contact plug 720 of the source contact area 700. In addition, the electric contact structure 600, the gate contact area 500 and the source contact area 700 may be of same conductive materials. In an embodiment, the contact plugs 610, 520 and 720 may be formed of a polysilicon material. In another embodiment, the contact plugs 610, 520 and 720 may be formed of a metal material such as tungsten, for example.

The electric contact structure 600 may be electrically coupled to the source contact area 700, wherein such an electrical coupling may be provided by a conductive line connecting the contact plug 610 of the electric contact structure 600 and the contact plug 720 of the source contact area 700. The contact plug 610 of the electric contact structure 600 may be extended in a lateral direction in an orthogonal direction to the section plane A-A' as shown in FIGS. 2A and 2B, thus the first electrostatic discharge protection structure 310 may be arranged under the gate contact area 500 along an edge portion 500*a* indicated by a dotted line in FIGS. 2A and 2B. The edge portion 500*a* may include the complete edge portion of the gate contact area 500 being neighboured to the source contact area 700 or only a part thereof, e.g. only one side of the gate contact area 500. The width of the edge portion 500*a* of the gate contact area 500 may be in a range of 20 µm to 100 µm, the width of the gate contact area 500 may be in a range of 100 µm to 1000 µm.

FIG. 3B is a schematic cross-sectional view of a portion of a semiconductor device according to another embodiment. Those features of the embodiment of FIG. 3B being similar to the features of the embodiment of FIG. 3A will not be described again and reference is drawn to the details given above.

As can be seen from FIG. 3B, the electric contact structure 600 is electrically coupled to a semiconductor region 130 within the semiconductor body 100, wherein the semiconductor region 130 may be electrically coupled to the source contact area 700. The semiconductor region 130 is of a second conductivity type to provide a pn-junction to the semiconductor body 100 of a first conductivity type. The electric contact structure 600 of FIG. 3B comprises a first contact plug 620, which extends through the first dielectric layer 410 of the second isolation layer 400 to be electrically coupled with the second terminal 314 of the first electrostatic discharge protection structure 310, a second contact plug 640 extending through the first dielectric layer 410 of the second isolation layer 400 and the first isolation layer 200 to be electrically coupled with the semiconductor region 130, and a bridging part 630 electrically connecting the first contact plug 620 and the second contact plug 640 of the electric contact structure 600 of FIG. 3B. The first isolation layer 200 includes a field oxide within an overlap area between the first and second electrostatic discharge protection structures 310, 320 and the semiconductor body 100, and a gate oxide having a smaller thickness than the field oxide in an overlap area between the gate contact area 500 and the semiconductor region 130. The second contact plug 640 of the electric contact structure 600 may be also arranged in an overlap area between the gate pad 530 and the semiconductor body 100. By providing the electric contact structure 600 being electrically coupled to the semiconductor body 100, the first electrostatic discharge protection structure 310 has an enhanced thermal coupling to the semiconductor body 100.

Figure 3C:
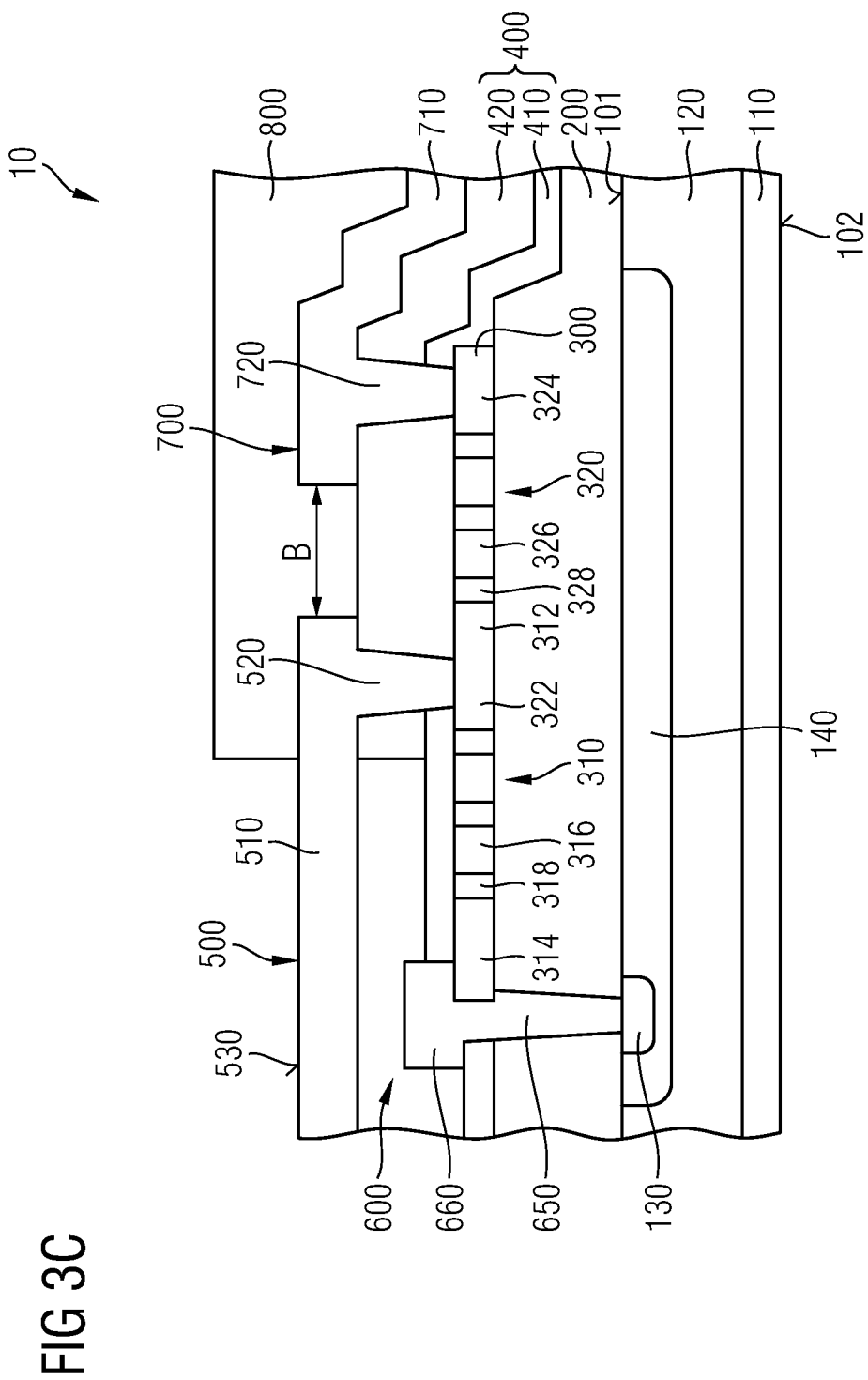

FIG. 3C is a cross-sectional view of a portion of a semiconductor device 10 according to still another embodiment. The features of the embodiment of FIG. 3C being similar to the features of the embodiments of FIG. 3A and FIG. 3B will not described again and reference is drawn to the details given above.

As shown in FIG. 3C, the electric contact structure 600 extends through the first isolation layer 200 along a vertical direction from the second terminal 314 of the first electrostatic discharge protection structure 310 to the semiconductor region 130 within the semiconductor body 100. The semiconductor region 130 of the second conductivity type is further embedded within a semiconductor well region 140 of the second conductivity type. The net dopant concentration of the semiconductor region 130 may be greater, e.g. 10 to 10000 times greater than the net dopant concentration of the semiconductor well region 140. The net dopant concentration of the semiconductor region 130 may be in a range of $1\times10^{18}$ cm$^{-3}$ to $5\times10^{20}$ cm$^{-3}$. The net dopant concentration of the semiconductor well region 140 may be in a range of $1\times10^{13}$ cm$^{-3}$ to $1\times10^{17}$ cm$^{-3}$.

By providing the semiconductor well region 140 in an overlap area between the first and second electrostatic discharge protection structures 310, 320 and the semiconductor body 100, an electrostatic shielding is provided by a reverse-biased pn-junction between the semiconductor well region 140 and the semiconductor body 100. The semiconductor well region 140 may also provide an isolation from neighboured well regions in the semiconductor body 100 of the first conductivity type. The electric contact structure 600 of FIG. 3C comprises a terminal contact part 660 abutting a top surface of the polysilicon layer 300 including the second terminal 314 of the first electrostatic discharge protection structure 310 and a side portion of the second terminal 314, and a contact plug 650 extending through the first dielectric layer 410 of the second isolation layer 400 and the first isolation layer 200 to be electrically coupled with the semiconductor region 130 within the semiconductor body 100.

The electric contact structure 600 of FIG. 3C may be formed by patterning the first dielectric layer 410 and the first isolation layer 200 such that the first surface 101 within the semiconductor region 130 as well as a part of the top surface of the polysilicon layer 300 including the second terminal 314 is exposed by a contact hole. Thereafter, the contact hole exposing the semiconductor region 130 and the second terminal 314 is filled by depositing a metal layer stack (e.g. Ti, TiN, W) or a polysilicon layer or combinations of this. By patterning of the metal or polysilicon layer, the electric contact structure 600 as shown in FIG. 3C is formed. Thereafter, the electric contact structure 600 is covered by the second dielectric layer 420 of the second isolation layer 400.

Figure 3D:
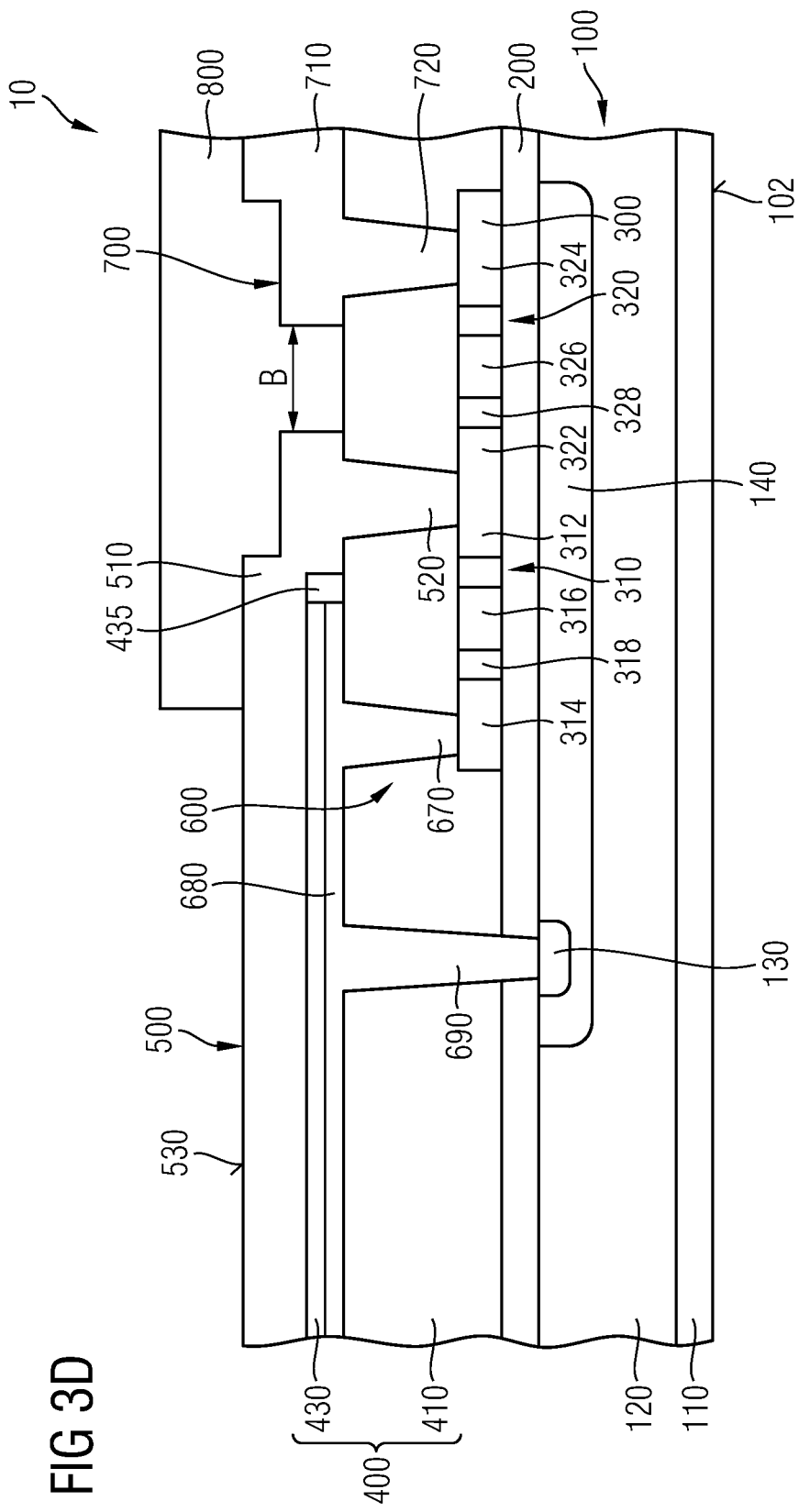

FIG. 3D is a cross-sectional view of a portion of a semiconductor device 10 according to still another embodiment. As can be seen from FIG. 3D, the first isolation layer 200 may be a gate dielectric. The first and second electrostatic discharge protection structures 310, 320 are formed on the thin first isolation layer 200, which leads to reduced thermal transient impedance due to the enhanced thermal coupling between the first and second electrostatic discharge protection structures 310, 320 and the semiconductor body 100. The gate dielectric may be a silicon oxide having a thickness in a range of 5 nm to 200 nm, or in a range of 40 nm to 120 nm.

In the embodiment of FIG. 3D, the electric contact structure 600 includes a first contact plug 670 being electrically coupled to the second terminal 314 of the first electrostatic discharge protection structure 310, a second contact plug 690 being electrically coupled to the semiconductor region 130 and a bridging part 680 for electrically connecting the first contact plug 670 and the second contact plug 690. The first contact plug 670 extends through the second isolation layer 400 and the second contact plug 690 extends through the first isolation layer 200 and the second isolation layer 400. On the bridging part 680, the third dielectric layer 430 is formed, wherein an oxide/nitride-spacer 435 is formed at an edge part of the bridging part 680, to electrically insulate the bridging part 680 from the gate contact area 500. In the embodiment of FIG. 3D, the second isolation layer 400 includes only the first dielectric layer 410 and the third dielectric layer 430. However, the second isolation layer 400 may comprise a multitude of dielectric layers. In addition, all features shown in FIG. 3A to FIG. 3D may be combined if it is not explicitly excluded. In particular, the different structures of the electric contact structure 600 may be combined with an existence or non-existence of a semiconductor well region 140. Further, in all embodiments the first isolation layer 200 may be a gate dielectric or a field dielectric.

FIG. 4A is a cross-sectional view of a portion of a semiconductor device 10 comprising transistor cells 900 arranged in an overlap area between the gate contact area 500 and the semiconductor body 100. As can be seen from FIG. 4A, the first and second electrostatic discharge protection structures 310, 320 are formed on the first isolation layer 200 being a gate dielectric. The electric contact structure 600 of FIG. 4A comprises a contact plug 610 having a similar structure as that of the contact plug 610 of the electric contact structure 600 of FIG. 3A. In an overlap area between the gate pad 530 and the semiconductor body 100, the transistor cells 900 are formed. Each of the transistor cells 900 comprise a gate electrode 330 formed on the first isolation layer, source zones 150 being in contact with the first surface 101 of the semiconductor body 100 and extending into the semiconductor body 100, and body zones 160, in which the source zones 150 are embedded. The source zones 150 are of the first conductivity type and the body zones 160 are of the second conductivity type. Furthermore, the drain region 110 of the first conductivity type is provided at the second surface 102 of the semiconductor body 100. The drift region 120 is formed between the drain region 110 and the body zones 160 and is of a first conductivity type. In case of a superjunction device, columns or bubbles of the first conductivity type and the second conductivity type can be implemented both beneath the semiconductor well region 140 and the active transistor cell field. Furthermore, columns or bubbles of the second conductivity type can be overlapping with the semiconductor well region 140.

In an embodiment, the gate electrodes 330 are formed simultaneously with the first and second electrostatic discharge protection structures 310, 320 and may be part of the polysilicon layer 300. The contact plug 610 of the electric contact structure 600 may be electrically coupled to the source contact area 700. The source contact plugs 730 may be electrically couple the source zones 150 to the source contact area 700.

The width of the overlap area between the gate contact area 500 and the first electrostatic discharge protection structure 310 may be in a range of 10 μm to 200 μm, or in a range of 20 μm to 100 μm.

According to an embodiment, the first electrostatic discharge protection structure 310 beneath the gate pad 500, as shown in FIGS. 3A, 3C, 3D, 4A and 4B, may also be folded along a lateral direction extending from the first terminal 312 to the second terminal 314. In particular, the first electrostatic discharge protection structure 310 may be mirrored or stacked, in order to enhance the diode width beneath the gate pad 500.

The width of the overlap area between the gate contact area 500 or the gate pad 530 and the transistor cells 900 may be in a range of 50 μm to 1000 μm.

FIG. 4B is a cross-sectional view of a portion of a semiconductor device 10 comprising transistor cells 900 arranged in an overlap area between the gate contact area 500 and the semiconductor body 100 according to another embodiment. The embodiment of FIG. 4B differs from the embodiment as shown in FIG. 4A in that the electric contact structure 600 comprises a contact plug 655, which extends through the second isolation layer 400 and the first isolation layer 200 while being electrically coupled to a top surface of the polysilicon layer 300 including the second terminal 314 of the first electrostatic discharge protection structure 310. In addition, the semiconductor region 130 is embedded in the semiconductor well region 140.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body having a first surface and a second surface opposite to the first surface,
a first isolation layer on the first surface of the semiconductor body,
a first electrostatic discharge protection structure on the first isolation layer, the first electrostatic discharge protection structure having a first terminal and a second terminal,
a second isolation layer on the first electrostatic discharge protection structure,
a gate contact pad on the second isolation layer, the gate contact pad being electrically coupled to the first terminal of the first electrostatic discharge protection structure,
an electric contact structure arranged in an overlap area between the gate contact pad and the semiconductor body, the electric contact structure being electrically coupled to the second terminal of the first electrostatic discharge protection structure and electrically isolated from the gate contact pad, and
a source contact pad on the second isolation layer, the source contact pad being electrically coupled to the electric contact structure;
wherein the gate contact pad and the source contact pad are separate parts of a same patterned metal wiring layer within a same wiring level, and
wherein a drain region of the semiconductor device is disposed at the second surface of the semiconductor body.

2. The semiconductor device of claim 1, wherein the first electrostatic discharge protection structure includes at least one polysilicon diode.

3. The semiconductor device of claim 1, wherein the first electrostatic discharge protection structure includes a polysilicon layer on the first isolation layer having first and second regions of opposite conductivity type alternatingly arranged along a lateral direction.

4. The semiconductor device of claim 3, wherein each of the first and second regions comprises first dopants of a first conductivity type, and the second regions further comprise second dopants of a second conductivity type overcompensating the first dopants.

5. The semiconductor device of claim 1, wherein an area of the first electrostatic discharge protection structure is more than 5000 μm$^2$, and wherein the first electrostatic discharge protection structure is adapted to protect a gate dielectric between gate and source from damage by dissipating energy caused by an electrostatic discharge event between the gate contact pad and the source contact pad.

6. The semiconductor device of claim 1, wherein the first electrostatic discharge protection structure is arranged in an overlap area between the gate contact pad and the first isolation layer.

7. The semiconductor device of claim 1, wherein at least 25% of the first electrostatic discharge protection structure is arranged in an overlap area between the gate contact pad and the first isolation layer.

8. The semiconductor device of claim 1, wherein the gate contact pad includes a gate pad.

9. The semiconductor device of claim 8, wherein at least a part of the electric contact structure is arranged in an overlap area between the gate pad and the semiconductor body.

10. The semiconductor device of claim 1, wherein the gate contact pad comprises a single metal wiring layer.

11. The semiconductor device of claim 1, further comprising
a second electrostatic discharge protection structure having a first terminal electrically coupled to the gate contact pad and a second terminal electrically coupled to the source contact pad.

12. The semiconductor device of claim 11, wherein the second terminal of the second electrostatic discharge protection structure is arranged in an overlap area between the source contact pad and the semiconductor body.

13. The semiconductor device of claim 11, wherein the first and the second electrostatic discharge protection structures have the first terminal in common.

14. The semiconductor device of claim 11, wherein the first and the second electrostatic discharge protection structures are diode chains being electrically connected in parallel and having the same number of diodes.

15. The semiconductor device of claim 1, wherein the electric contact structure is electrically coupled to a semiconductor region within the semiconductor body, the semiconductor region being electrically coupled to the source contact pad.

16. The semiconductor device of claim 15, wherein the electric contact structure extends through the first isolation layer along a vertical direction from the second terminal of the first electrostatic discharge protection structure to the semiconductor region.

17. The semiconductor device of claim 1, wherein the first isolation layer is a gate dielectric.

18. The semiconductor device of claim 1, further comprising transistor cells formed between the gate contact pad and the second surface of the semiconductor body.

19. The semiconductor device of claim 1, wherein the semiconductor device is at least one of a group consisting of a field effect transistor, a superjunction transistor, an insulated gate bipolar transistor, and a trench field effect transistor.

20. The semiconductor device of claim 1, wherein the electric contact structure and the gate contact pad are of the same conductive material.

* * * * *